United States Patent
Han et al.

(10) Patent No.: US 11,716,876 B2
(45) Date of Patent: Aug. 1, 2023

(54) DISPLAY PANEL, MANUFACTURE METHOD THEREOF AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Linhong Han, Beijing (CN); Young Yik Ko, Beijing (CN); Yi Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/699,238

(22) Filed: Mar. 21, 2022

(65) Prior Publication Data

US 2022/0254839 A1   Aug. 11, 2022

Related U.S. Application Data

(63) Continuation of application No. 16/768,497, filed as application No. PCT/CN2019/114732 on Oct. 31, 2019, now Pat. No. 11,322,567.

(30) Foreign Application Priority Data

Jan. 25, 2019   (CN) .......................... 201910072755.5

(51) Int. Cl.
*G09G 3/3233* (2016.01)
*H10K 59/121* (2023.01)
(Continued)

(52) U.S. Cl.
CPC ......... *H10K 59/121* (2023.02); *G09G 3/3233* (2013.01); *H10K 59/65* (2023.02);
(Continued)

(58) Field of Classification Search
CPC ..... G06K 9/0004; G06F 3/042; G06F 3/0421; G09G 2360/14; H01L 27/3269;
(Continued)

(56) References Cited

U.S. PATENT DOCUMENTS

2016/0043148 A1   2/2016   Wu et al.
2017/0162111 A1*  6/2017   Kang ................... G09G 3/3225
(Continued)

FOREIGN PATENT DOCUMENTS

CN   103545344 A   1/2014
CN   205355055 U   6/2016
(Continued)

OTHER PUBLICATIONS

Chinese Office Action dated Dec. 31, 2019 related Chinese Application No. 201910072755.5.
(Continued)

*Primary Examiner* — Yuzhen Shen
(74) *Attorney, Agent, or Firm* — ArentFox Schiff LLP; Michael Fainberg

(57) ABSTRACT

A display panel, a manufacture method thereof and a display apparatus are provided. The display panel includes a display area, which includes a plurality of pixel units, wherein the pixel units include electroluminescent display devices and pixel drive circuits for driving the electroluminescent display devices to emit light; the electroluminescent display devices include light-emitting devices and virtual light-emitting devices; the light-emitting devices are electrically connected with the pixel drive circuits, while the virtual light-emitting devices are not connected with the corresponding pixel drive circuits; the display area includes a first display area and a second display area; and in the first display area and the second display area, the distribution density of the electroluminescent display devices is the
(Continued)

same, and the density of the pixel drive circuits in the second display area is less than that of the pixel drive circuits in the first display area.

20 Claims, 11 Drawing Sheets

(51) Int. Cl.
| | |
|---|---|
| *H10K 59/65* | (2023.01) |
| *H10K 59/88* | (2023.01) |
| *H10K 71/00* | (2023.01) |
| *H10K 71/16* | (2023.01) |
| *H10K 59/12* | (2023.01) |

(52) U.S. Cl.
CPC ............ *H10K 59/88* (2023.02); *H10K 71/00* (2023.02); *H10K 71/164* (2023.02); *H10K 71/166* (2023.02); *G09G 2300/0452* (2013.01); *G09G 2300/0465* (2013.01); *G09G 2300/0804* (2013.01); *G09G 2320/0233* (2013.01); *G09G 2320/043* (2013.01); *G09G 2330/021* (2013.01); *G09G 2360/14* (2013.01); *H10K 59/1201* (2023.02)

(58) Field of Classification Search
CPC ........... H01L 27/3227; H01L 27/14623; H01L 29/78633; H01L 27/3211; H01L 27/3216; H01L 27/3218; H01L 27/326; G02F 2201/52
See application file for complete search history.

(56) References Cited

U.S. PATENT DOCUMENTS

| | | |
|---|---|---|
| 2018/0025692 A1 | 1/2018 | Yata |
| 2018/0088260 A1 | 3/2018 | Jin et al. |
| 2019/0096962 A1* | 3/2019 | Han ................... H01L 51/56 |
| 2020/0019747 A1* | 1/2020 | Yang .................. H01L 27/3276 |
| 2020/0203445 A1 | 6/2020 | Ou et al. |
| 2020/0227488 A1 | 7/2020 | Xin et al. |

FOREIGN PATENT DOCUMENTS

| | | | | |
|---|---|---|---|---|
| CN | 107819018 A | * | 3/2018 | ......... H01L 27/3227 |
| CN | 107819018 A | | 3/2018 | |
| CN | 207338380 U | | 5/2018 | |
| CN | 108279523 A | | 7/2018 | |
| CN | 108615746 A | | 10/2018 | |
| CN | 108922900 A | | 11/2018 | |
| CN | 109192076 A | | 1/2019 | |
| CN | 208386635 U | | 1/2019 | |
| CN | 109584794 A | | 4/2019 | |
| JP | 2018013718 A | | 1/2018 | |

OTHER PUBLICATIONS

Decision of Rejection dated Jul. 15, 2020 related Chinese Application No. 201910072755.5.
Final Office Action for Corresponding U.S. Appl. No. 16/768,497 dated Dec. 27, 2021.
Non Final Final Office Action for Corresponding U.S. Appl. No. 16/768,497 dated Sep. 30, 2021.

* cited by examiner

DISPLAY PANEL, MANUFACTURE METHOD THEREOF AND DISPLAY APPARATUS

CROSS REFERENCE TO RELATED APPLICATIONS

The present application is a continuation application of U.S. patent application Ser. No. 16/768,497, filed on Oct. 31, 2019, which claims priority to Chinese Patent Application No. 201910072755.5 filed with Chinese Patent Office on Jan. 25, 2019, and entitled "Display Panel, Manufacture Method Thereof and Display Apparatus", which is hereby incorporated by reference in its entirety.

FIELD

The present disclosure relates to the technical field of display, and particularly to a display panel, a manufacture method thereof and a display apparatus.

BACKGROUND

Electroluminescent display devices are widely applied due to their own characteristics. At present, with the development of small and medium-sized display screens, terminal display products are developing in the direction of smaller and smaller appearance bezels. Photosensitive elements that need to be equipped with intelligent functions such as an infrared sensor function will occupy most of the bezel. To solve this contradiction, a more effective solution is to place an infrared sensor and other photosensitive elements on the back of the display screen. In this way, there will be a new problem: the infrared light transmittance is greatly reduced by the wiring density in a backplane circuit, and the purpose of the current infrared detection and other functions cannot be achieved.

SUMMARY

An embodiment of the present disclosure provides a display panel. The display panel includes: a display area, which has a plurality of pixel units, wherein the pixel units include electroluminescent display devices and pixel drive circuits for driving the electroluminescent display devices to emit light; the electroluminescent display devices include light-emitting devices and virtual light-emitting devices; the light-emitting devices are electrically connected with the pixel drive circuits, and the virtual light-emitting device are not connected with the corresponding pixel drive circuits; wherein the display area includes a first display area and a second display area; and a distribution density of the electroluminescent display devices in the first display area and the second display area is same, and a density of the pixel drive circuits in the second display area is less than that of the pixel drive circuits in the first display area.

Optionally, in the embodiment of the present disclosure, one light-emitting device is electrically connected to one pixel drive circuit.

Optionally, in the embodiment of the present disclosure, in the second display area, at least two light-emitting devices with same light emitting color are electrically connected to a same pixel drive circuit.

Optionally, in the embodiment of the present disclosure, in the second display area, at least part of the light-emitting devices electrically connected to the same pixel drive circuit are arranged in at least two columns.

Optionally, in the embodiment of the present disclosure, the light-emitting devices include: red light-emitting devices, green light-emitting devices and blue light-emitting devices; in the second display area, the red light-emitting devices electrically connected to the same pixel drive circuit are arranged in at least two columns, and the red light-emitting devices in adjacent columns are staggered; and in the second display area, the blue light-emitting devices electrically connected to the same pixel drive circuit are arranged in at least two columns, and the blue light-emitting devices in adjacent columns are staggered.

Optionally, in the embodiment of the present disclosure, in the second display area, a part of the green light-emitting devices electrically connected to the same pixel drive circuit are arranged in at least two columns, and at least some of the green light-emitting devices in the adjacent columns are arranged in the same row; and in the second display area, the other part green light-emitting devices electrically connected to the same pixel drive circuit are arranged in a column.

Optionally, in the embodiment of the present disclosure, in the second display area, the green light-emitting devices electrically connected to the same pixel drive circuit are arranged in at least two columns, and the green light-emitting devices in the adjacent columns are staggered.

Optionally, in the embodiment of the present disclosure, the pixel drive circuit includes a drive transistor, wherein in the second display area, the drive transistor is electrically connected to the corresponding light-emitting device through an anode wiring.

Optionally, in the embodiment of the present disclosure, at least part of the edges of the second display area overlap with at least part of the edges of the display area, and the other part of the second display area is tangent to the first display area.

Optionally, in the embodiment of the present disclosure, the first display area is arranged to enclose the second display area.

A display apparatus provided by the embodiment of the present disclosure includes the above display panel.

Optionally, in the embodiment of the present disclosure, a sensor is arranged on a back of the display panel corresponding to a second display area, and an orthographic projection of the sensor does not overlap with an orthographic projection of a pixel drive circuit on the display panel.

The embodiment of the present disclosure provides a method for manufacturing the above display panel. The method includes: forming the pixel drive circuits in the first display area and the second display area of the base substrate; and forming the electroluminescent display devices using same fine metal mask in the first display area and the second display area of the base substrate with the pixel drive circuits, wherein open density of the fine metal mask corresponding to the first display area is the same as that corresponding to the second display area.

DETAILED DESCRIPTION

Figure 1A:
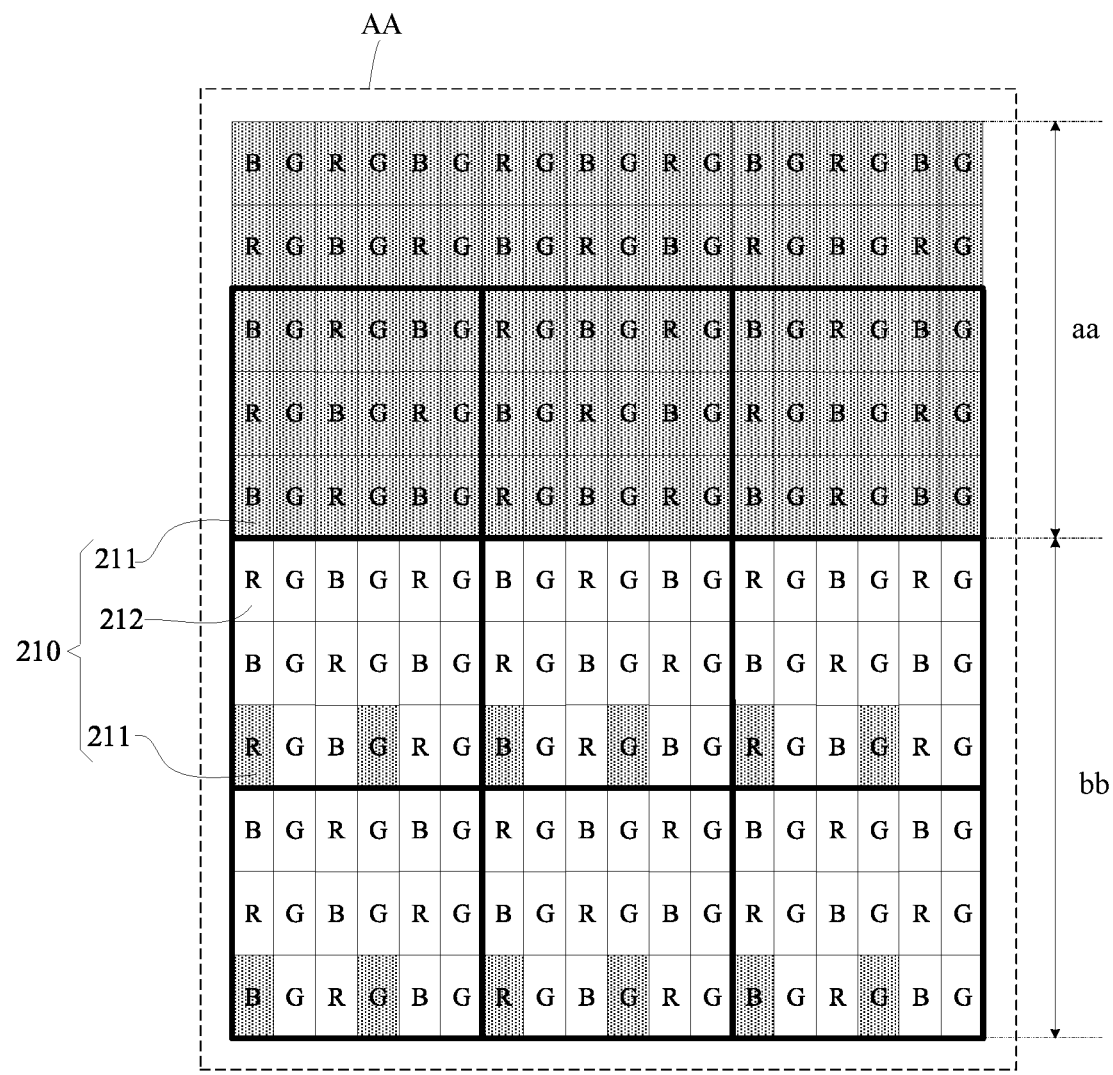
FIG. 1A is a schematic structural diagram of some display panels provided by an embodiment of the present disclosure.

In order to make the objects, technical solutions and advantages of the present disclosure clearer, the present disclosure will be further described in detail below with reference to the accompanying drawings. Obviously, the described embodiments are only a part of the embodiments of the present disclosure rather than all the embodiments. Based on the embodiments of the present disclosure, all other embodiments obtained by those of ordinary skill in the art without inventive efforts fall within the protection scope of the present disclosure.

The shapes and sizes of the components in the drawings do not reflect the true ratio, and the purpose is only to illustrate the content of the present disclosure.

Figure 2A:
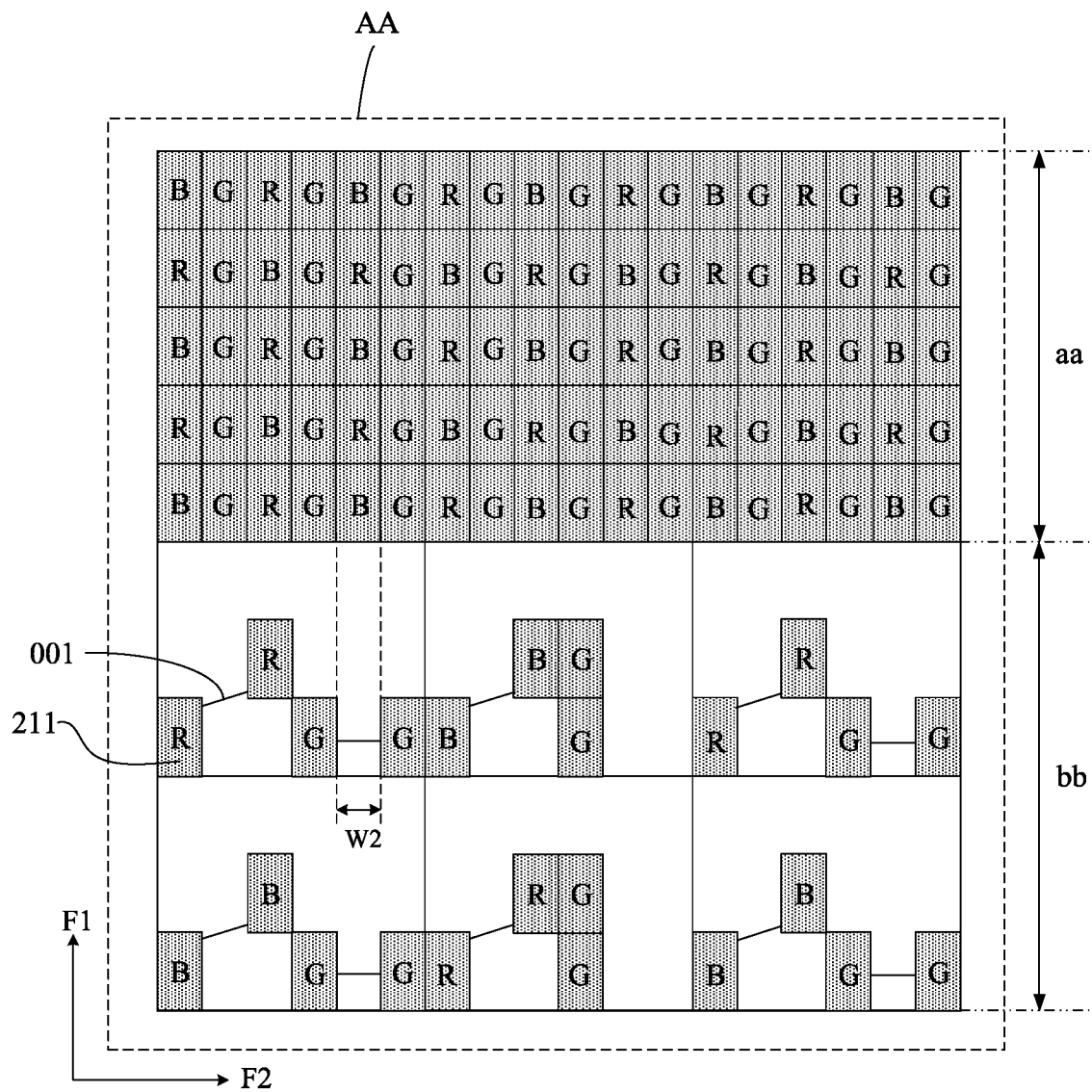
FIG. 2A is a schematic structural diagram of some more display panels provided by an embodiment of the present disclosure.
Figure 3A:
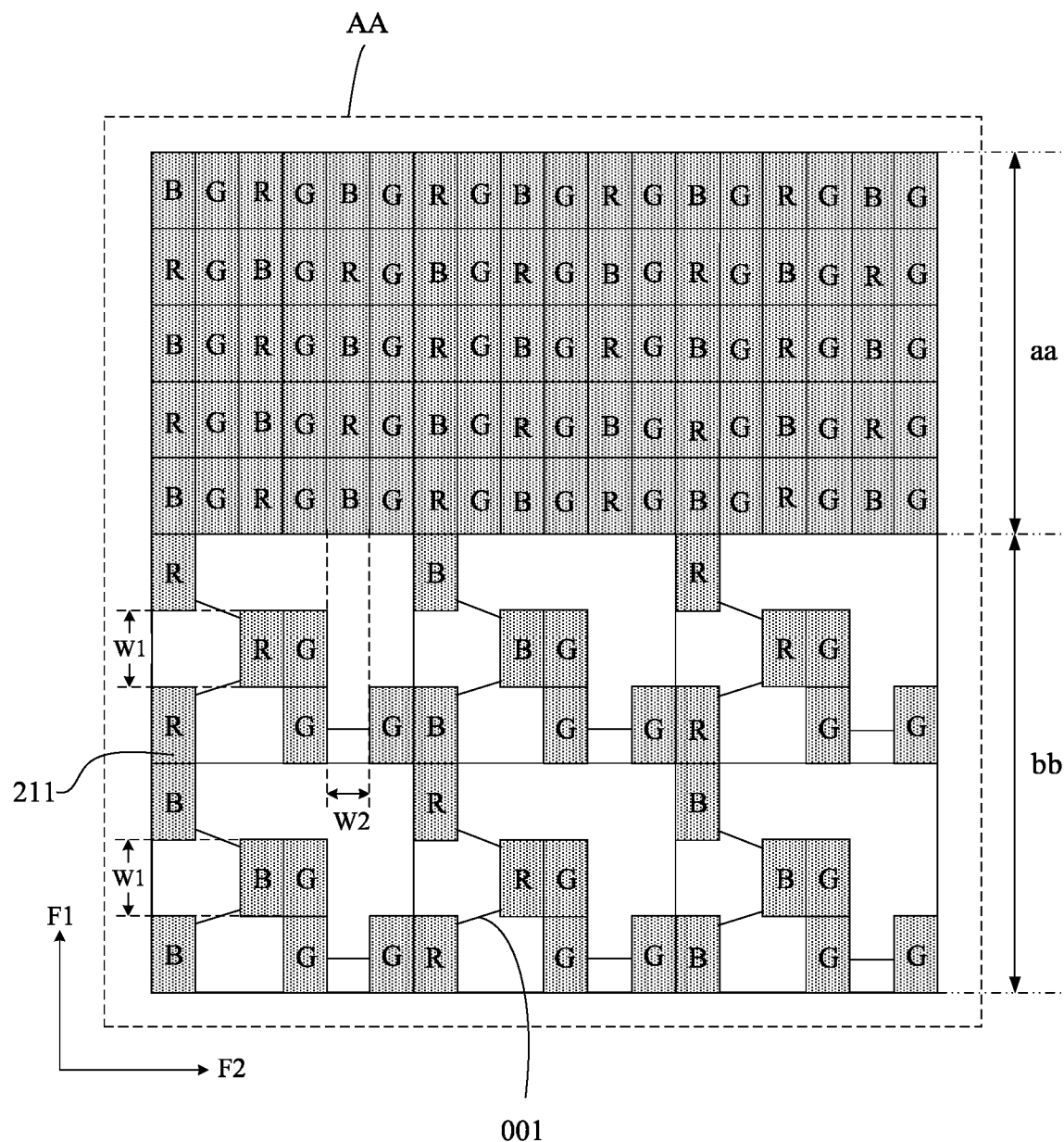
FIG. 3A is a schematic structural diagram of some more display panels provided by an embodiment of the present disclosure.

A display panel provided by an embodiment of the present disclosure, as shown in FIGS. 1A, 2A, and 3A, may include a display area AA. The display area AA has a plurality of pixel units, wherein the pixel unit includes an electroluminescent display device and a pixel drive circuit for driving the electroluminescent display device to emit light. The electroluminescent display device may include a light-emitting device and a virtual light-emitting device; and the light-emitting device is electrically connected with the pixel drive circuit, while the virtual light-emitting device is not connected with the corresponding pixel drive circuit. In addition, the display area AA may include a first display area aa and a second display area bb; and each of the first display area aa and the second display area bb has a plurality of pixel units. The distribution density of the electroluminescent display devices is the same in the first display area aa and the second display area bb, and distribution density of the pixel drive circuits in the second display area bb is less than that of the pixel drive circuits in the first display area aa.

In the display panel provided by the embodiment of the present disclosure, the distribution density of electroluminescent display devices in the first display area aa and the second display area bb equal, thus it may adopt the same mask to prepare the electroluminescent display devices. Since the pixel drive circuit is electrically connected with at least one light-emitting device to drive light-emitting device to emit the light, the transmittance of the second display area may be improved by making the distribution density of the pixel drive circuits in the second display area bb less than that of the pixel drive circuits in the first display area aa. So a sensor and other elements may be arranged on a back of the display panel corresponding to the second display area bb so that a bezel space originally required by the sensor and other elements may be eliminated, and a screen ratio of a display screen may be enlarged to make an extremely narrow bezel. That is, a screen ratio of the display panel is increased by reducing distribution density of local pixel drive circuits to increase the transmittance of the screen.

In general, the pixel units are arranged in the display area of the display panel, the pixel unit includes a plurality of sub-pixels. The pixel unit in the embodiment of the present disclosure may be a sub-pixel combination capable of independently displaying a pixel point. Optionally, as shown in FIGS. 1A, 2A and 3A, the display panel may include: a plurality of red sub-pixels R, a plurality of green sub-pixels G, and a plurality of blue sub-pixels B. Among them, these red sub-pixels R, green sub-pixels G and blue sub-pixels B are arranged in a Pantile arrangement manner. In this way, adjacent pixel units adopt the way of using common sub-pixels during display to mix red, green and blue colors to achieve image display. It should be noted that red sub-pixels R, green sub-pixels G and blue sub-pixels B are taken as examples for illustration in FIG. 1A, FIG. 2A and FIG. 3A. The pixels as shown in FIG. 1A, FIG. 2A and FIG. 3A in the embodiment of the present disclosure are arranged in the manner of using the common sub-pixels by the adjacent pixel units.

It should be noted that the distribution density of electroluminescent display devices refers to the number of electroluminescent display devices uniformly arranged in a unit area. When the number of the electroluminescent display devices arranged in the unit area is large, the distribution density of the electroluminescent display devices is large. On the contrary, when the number of the electroluminescent display devices arranged in unit area is small, the distribution density of the electroluminescent display devices is small. For example, when an area of a rectangular box formed by thick solid black lines in FIG. 1A, FIG. 2A and FIG. 3A, for example, is the unit area, the distribution density of the electroluminescent display devices in the first display area aa and the second display area bb is the same. In this way, the same Fine Metal Mask (FFM) may be used to form the electroluminescent devices with the same color in the first display area.

It should be noted that, in the embodiment of the present disclosure, the distribution density of the pixel drive circuits refers to the number of pixel drive circuits uniformly arranged in a unit area. When the number of the pixel drive circuits in the unit area is large, the distribution density of the pixel drive circuits is large. On the contrary, when the number of the pixel drive circuits in the unit area is small, the distribution density of the pixel drive circuits is small. For example, when an area of a rectangular box formed by thick solid black lines in FIG. 1A, FIG. 2A and FIG. 3A, for example, is the unit area, the distribution density of the pixel drive circuits in the second display area bb is less than that in the first display area aa.

In a specific implementation, in the embodiment of the present disclosure, as shown in FIG. 6A to FIG. 6G, at least some edges of the second display area bb overlap with at least some edges of the display area AA, and the rest of the second display area bb is tangent to the first display area aa. In this way, the second display area bb is arranged at an edge of the display area AA.

Figure 6A:
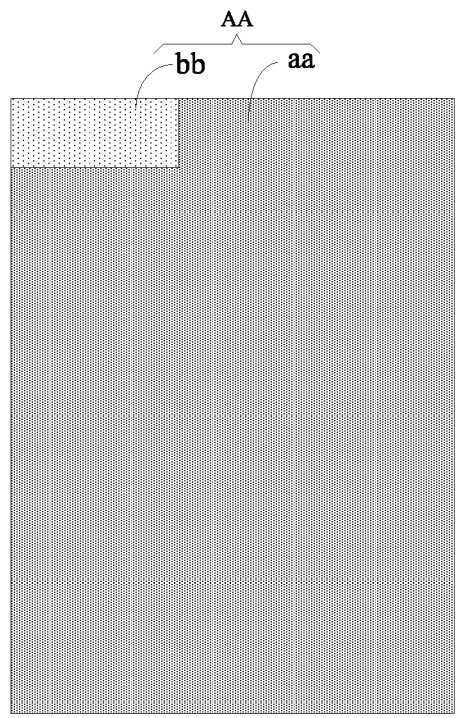
FIG. 6A to FIG. 6H are schematic structural diagrams of a first display area and a second display area, respectively.
Figure 6B:
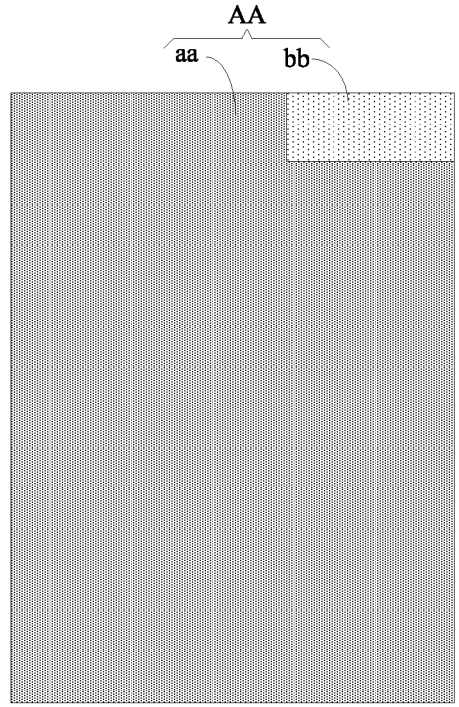
Figure 6C:
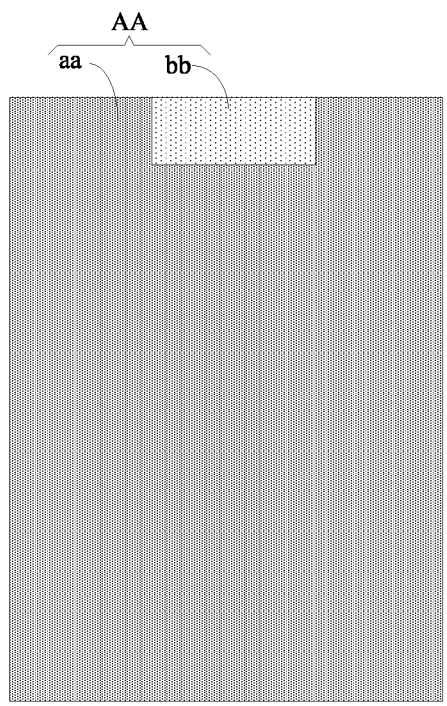
Figure 6D:
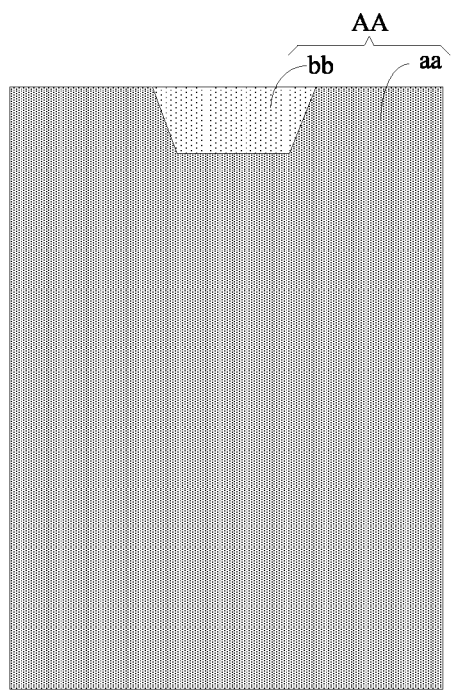
Figure 6E:
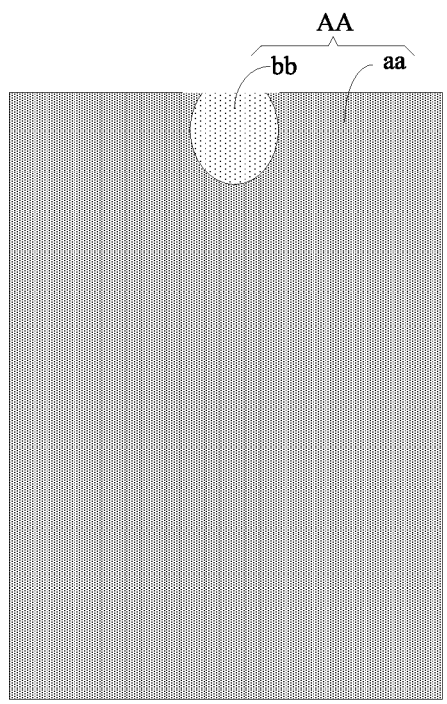
Figure 6F:
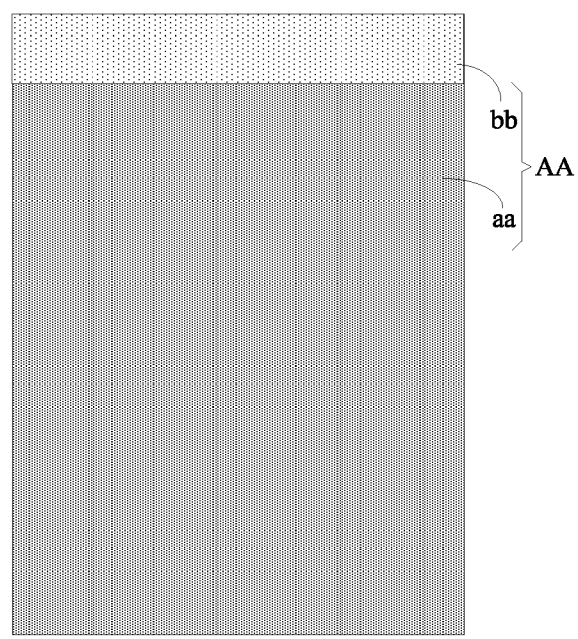
Figure 6G:
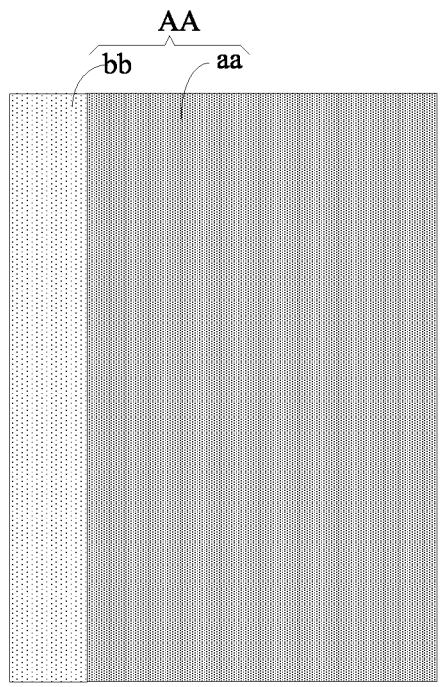
Figure 6H:
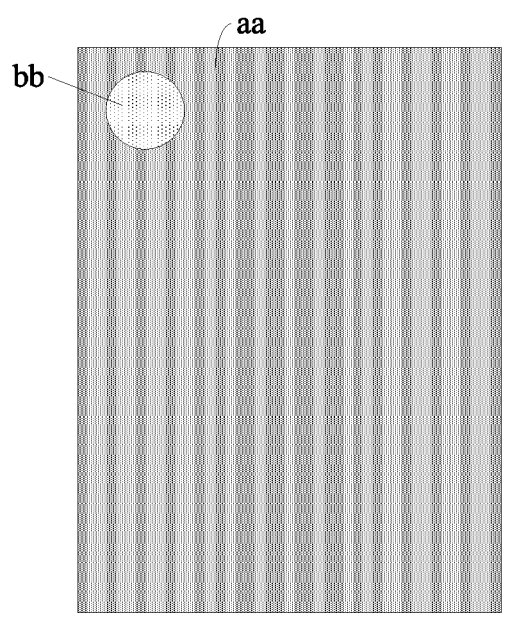

In a specific implementation, in the embodiment of the present disclosure, as shown in FIG. 6H, the first display area aa is arranged to enclose the second display area bb.

Exemplarily, a shape of the second display area bb may be arranged to be a regular shape, for example, as shown in FIGS. 6A to 6C, and the second display area bb may be arranged to be a rectangle. The corner of the rectangle may be a right angle or an arc angle. As shown in FIG. 6D, the second display area bb may be arranged to be a trapezoid. The corner of the trapezoid may be a normal angle or an arc angle. As shown in FIG. 6H, the second display area bb may be arranged to be a circle. Of course, the shape of the second display area bb may also be arranged to be an irregular shape. For example, as shown in FIG. 6E, the second display area bb may be arranged to be a droplet shape. Of course, in practical application, the shape of the second display area bb may be designed according to a shape of an element arranged in the second display area, and no limitation will be made herein.

In a specific implementation, in the display substrate provided by the embodiment of the present disclosure, a relative position relation and shapes of the first display area aa and the second display area bb are not limited, and may be arranged according to screen design of the display substrate. Take a mobile phone as an example, as shown in FIG. 6A, the second display area bb may be arranged in an upper left corner of the first display area aa. As shown in FIG. 6B, the second display area bb is arranged in an upper right corner of the first display area aa. As shown in FIG. 6C to FIG. 6E, the second display area bb may be arranged in an upper middle of the first display area aa. As shown in FIG. 6F, the first display area aa and the second display area bb may be arranged along a row direction. The second display area bb may be located on an upper or lower side of the first display area aa. In this way, sensors such as sensors for face recognition (such as infrared sensors) may also be arranged in an area where the second display area bb is located. As shown in FIG. 6G, the first display area aa and the second display area bb may be arranged along a column direction. The second display area bb may be located on a left or right side of the first display area aa. In this way, sensors such as the sensors for face recognition (such as the infrared sensors) may also be arranged in the area where the second display area bb is located. As shown in FIG. 6H, the second display area bb is arranged in a corner (such as an upper left corner) of the display area. Of course, in practical application, a specific location of the second display area bb may be designed and determined according to an actual application environment, and no limitation will be made herein.

It should be noted that, in order to schematically illustrate the content of the embodiments of the present disclosure, FIG. 1A, FIG. 2A, and FIG. 3A only illustrate pixel arrangement of a part of the display area.

It should be noted that pixel arrangement of the second display area bb is the same as pixel arrangement of the first display area aa. The second display area bb in FIGS. 1A, 2A, and 3A in the embodiment of the present disclosure is for describing a connection relationship between the pixel drive circuit and the light-emitting devices, and only illustrates some sub-pixels.

In specific implementation, in the embodiment of the present disclosure, the electroluminescent display devices may include at least one of Organic Light Emitting Diode (OLED) and Quantum Dot Light Emitting Diodes (QLED).

In specific implementation, in the embodiment of the present disclosure, the pixel drive circuit may include a plurality of transistors such as a drive transistor and a switching transistor, and a storage capacitor, and its specific structure and working principle may be the same as those in related technologies, so it will not be detailed here.

Figure 5:
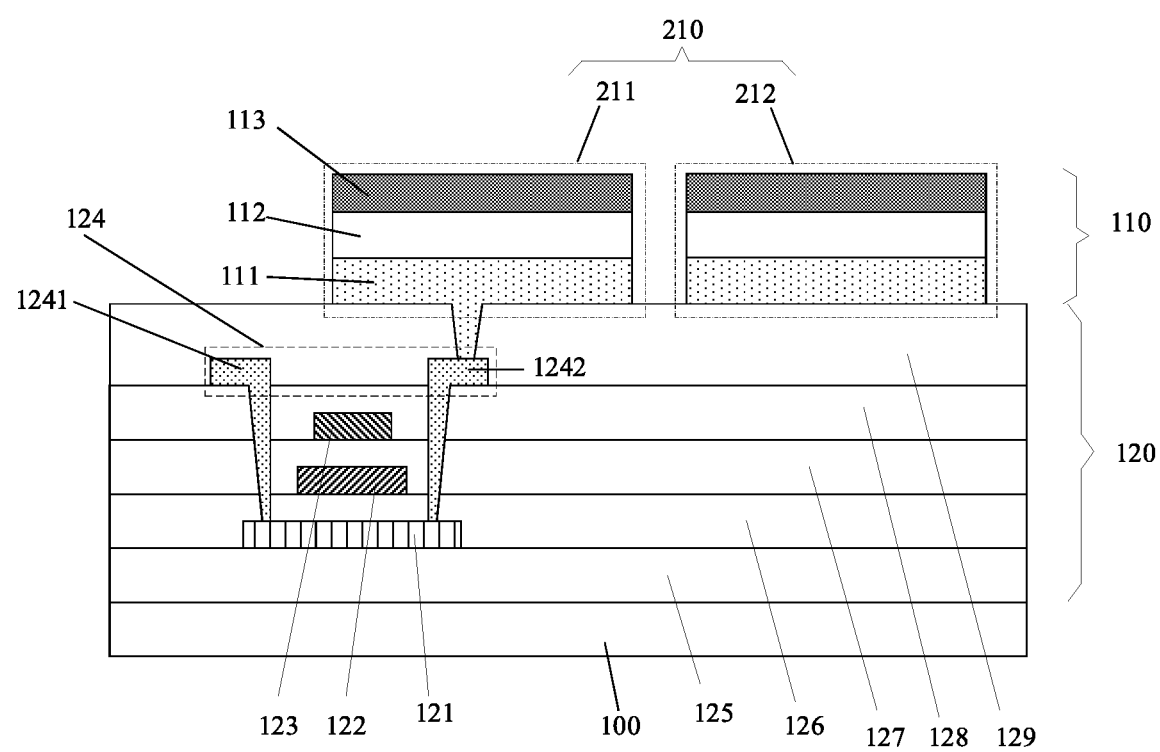
FIG. 5 is a schematic diagram of a partially sectional structure provided by an embodiment of the present disclosure.

Exemplarily, as shown in FIG. 5, the display panel may include a base substrate 100, a transistor array layer 120 on one side of the base substrate 100, and a display device layer 110 on one side of the transistor array layer 120 away from the base substrate 100. The transistor array layer 120 is configured to form the layers of the transistor in the above pixel drive circuit and the layers of the capacitor. The display device layer 110 is configured to form the above electroluminescent display device 210. Specifically, the transistor array layer 120 may include: an active layer 121 on one side of the base substrate 100, a gate layer 122 on one side of the active layer 121 away from the base substrate 100, a capacitor electrode layer 123 on one side of the gate layer 122 away from the base substrate 100, and a source/drain layer 124 (with a source 1241 and a drain 1242) on one side of the capacitor electrode layer 123 away from the base substrate 100. The active layer 121, the gate layer 122 and the capacitor electrode layer 123 are insulated from each other; the source/drain layer 124, the gate layer 122 and the capacitor electrode layer 123 are insulated from each other; and the source 1241 and the drain 1242 are electrically connected to the active layer 121, respectively. Also, the transistor array layer 120 further includes: a buffer layer 125 between the base substrate 100 and the active layer 121, a gate insulating layer 126 between the active layer 121 and the gate layer 122 so that the active layer 121 and the gate layer 122 are insulated from each other, an interlayer dielectric layer 127 between the gate layer 122 and the capacitor electrode layer 123 so that the gate layer 122 and the capacitor electrode layer 123 are insulated from each other, an interlayer insulating layer 128 between the capacitor electrode layer 123 and the source/drain layer 124 so that the capacitor electrode layer 123 and the source/drain layer 124 are insulated from each other, and a planarization layer 129 between the source/drain layer 124 and the display device layer 110. In addition, the capacitor electrode layer 223 and the gate layer 222 form a capacitive structure. Furthermore, the display device layer 110 includes an anode 111, an electroluminescent layer 112, and a cathode layer 113 which are stacked on the base substrate 100. It should be noted that FIG. 5 illustrates only one transistor in a pixel drive circuit as an example.

In a specific implementation, in the embodiment of the present disclosure, as shown in FIG. 1A, FIG. 2A, FIG. 3A and FIG. 5, the electroluminescent display device 210 may include: a light-emitting device 211 and a virtual light-emitting device 212. An anode of the light-emitting device 211 is electrically connected to the drain 1242 through a via hole penetrating through the planarization layer 129, and a cathode of the light-emitting device 211 is electrically connected to a cathode power source line, so that a drive signal is provided to the light-emitting device 211 through the drain 1242. And a low voltage signal is provided to the light-emitting device 211 through the cathode power source line so as to drive the light-emitting device 211 to emit the light. Also, an anode of the virtual light-emitting device 212 is not electrically connected to the pixel drive circuit, so it is not used for light-emitting display.

In a specific implementation, in the embodiment of the present disclosure, the light-emitting device 211 and the virtual light-emitting device 212 are substantially the same in the aspects of manufacture methods and structures formed.

In a specific implementation, in the embodiment of the present disclosure, as shown in FIG. 1A, FIG. 2A, and FIG. 3A, sub-pixels of a shaded area are equipped with the light-emitting device 110 so that the sub-pixels of the shaded area may be applied to light-emitting display. Sub-pixels of a white area have virtual light-emitting device 120 so that the sub-pixels of the white area may not be applied to the light-emitting display.

In a specific implementation, in the embodiment of the present disclosure, as shown in FIG. 1A, FIG. 2A and FIG. 3A, one light-emitting device 110 may be electrically connected to one pixel drive circuit correspondingly. For example, each sub-pixel in the first display area aa is provided with the light-emitting device 110 and the pixel drive circuit electrically connected to the light-emitting device 110 correspondingly. In other words, each sub-pixel in the first display area aa has the pixel drive circuit to drive the light-emitting device 211 electrically connected thereto to emit the light through the pixel drive circuit. Part of the sub-pixels (that is, the sub-pixels in the shaded area) in the second display area bb are provided with the light-emitting device 110, respectively, and the rest of the sub-pixels (that is, the sub-pixels in the white area) are provided with the virtual light-emitting device 120, respectively. In addition, the second display area bb further includes pixel drive circuits electrically connected to the light-emitting devices 110 in a one-to-one correspondence. In other words, the light-emitting device 211 of some sub-pixels in the second display area bb are electrically connected to the pixel drive circuits, to drive the light-emitting devices 211 to emit the light through the pixel drive circuit.

Figure 1B:
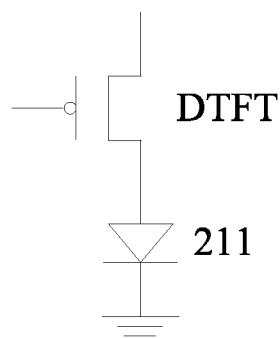
FIG. 1B is a schematic structural diagram of a pixel drive circuit and a light-emitting device in a second display area of the display panel shown in FIG. 1A.

In the specific implementation, in the embodiment of the present disclosure, as shown in FIG. 1B, each pixel drive circuit may include a drive transistor DTFT, and the pixel drive circuit is configured to drive the light-emitting device 211 to emit light by a current flowing through the drive transistor DTFT. FIG. 1B only illustrates a correspondence between the drive transistor DTFT and the light-emitting device 211, and the light-emitting devices 211 one-to-one correspond to the pixel drive circuits. That is, one drive transistor DTFT is only electrically connected to one light-emitting device 211. Furthermore, the drive transistor is electrically connected to the corresponding light-emitting device by an anode wire.

Exemplarily, in the first display area aa, each red sub-pixel R has a light-emitting device 211 and a pixel drive circuit electrically connected to the light-emitting device. Each green sub-pixel G has a light-emitting device 211 and a pixel drive circuit electrically connected to the light-emitting device. Each blue sub-pixel B has a light-emitting device 211 and a pixel drive circuit electrically connected to the light-emitting device.

Exemplarily, in the second display area bb, each red sub-pixel R in a shaded area has a light-emitting device 211 and a pixel drive circuit electrically connected to the light-emitting device, and each red sub-pixel R in a white area has a virtual light-emitting device 212. Each green sub-pixel G in a shaded area has a light-emitting device 211 and a pixel drive circuit electrically connected to the light-emitting device, and each green sub-pixel G in a white area has a virtual light-emitting device 212. Each blue sub-pixel B in a shaded region has a light-emitting device 211 and a pixel drive circuit electrically connected to the light-emitting device, and each blue sub-pixel B in a white area has a virtual light-emitting device 212. Of course, the pixel drive circuit may also be arranged in the sub-pixel with the virtual light-emitting device 212, and no limitation will be made herein.

In specific implementation, in the embodiment of the present disclosure, the light-emitting devices 211 in the second display area bb are uniformly distributed. Further, the pixel drive circuits in the second display area bb are uniformly distributed. This may make transmittance in the second display area bb more uniform.

In specific implementation, in the embodiment of the present disclosure, as shown in FIG. 5, an orthographic projection of a light-emitting device 211 on the display panel (such as the base substrate 100 wherein) overlaps with an orthographic projection of the area of the pixel drive circuit electrically connected to the light-emitting device 211 on the display panel (such as the base substrate 100 wherein). This arrangement may improve an occupied area of the light-emitting device 211.

It should be noted that the light-emitting device 211 in the red sub-pixel R may emit red light, that is, the light-emitting device 211 may be a red light-emitting device. The light-emitting device 211 in the green sub-pixel G may emit green light, that is, the light-emitting device 211 may be a green light-emitting device. The light-emitting device 211 in the blue sub-pixel B may emit blue light, that is, the light-emitting device 211 may be a blue light-emitting device.

The embodiment of the present disclosure provides a schematic structural diagram of some more display panels, as shown in FIG. 2A and FIG. 3A, which are deformed according to the implementation in the above embodiment. The differences between this embodiment and the aforementioned embodiment are only described below, and the similarities are not repeated here.

In specific implementation, in the embodiment of the present disclosure, as shown in FIG. 2A and FIG. 3A, in the second display area, at least two light-emitting devices 211 with the same light emitting color are electrically connected to the same pixel drive circuit. This may improve the life and luminance of light-emitting devices.

Exemplarily, at least two red light-emitting devices may share the same pixel drive circuit, at least two green light-emitting devices may share the same pixel drive circuit, and at least two blue light-emitting devices may also share the same pixel drive circuit. For example, FIG. 2A shows two light-emitting devices with the same light emitting color sharing the same pixel drive circuit. For example, two red light-emitting devices 211 in the red sub-pixels R are electrically connected to the same pixel drive circuit, two green light-emitting devices 211 in the green sub-pixels G are electrically connected to the same pixel drive circuit, and two blue light-emitting devices 211 in the blue sub-pixels B are electrically connected to the same pixel drive circuit. For example, as shown in FIG. 3A, in the second display area bb, at least three light-emitting devices 211 with the same light emitting color are electrically connected to the same pixel drive circuit. For example, three red light-emitting devices 211 in the red sub-pixels R are electrically connected to the same pixel drive circuit, three green light-emitting devices 211 in the green sub-pixels G are electrically connected to the same pixel drive circuit, and three blue light-emitting devices 211 in the blue sub-pixels B are electrically connected to the same pixel drive circuit. Of course, in specific implementation, there may also be more light-emitting devices with the same light emitting color are electrically connected to the same pixel drive circuit, which may be designed according to actual needs, and no limitation will be made herein.

It should be noted that in FIG. 2A and FIG. 3A, only the red sub-pixel R (that is, the red sub-pixel R in a shaded area), the green sub-pixel G (that is, the green sub-pixel G in a shaded area) and the blue sub-pixel B (that is, the blue sub-pixel B in a shaded area) with the light-emitting devices 211 are only illustrated. The white area in the second display area bb is the sub-pixel provided with the virtual light-emitting device 212, which may be seen in FIG. 1A, and no details will be repeated herein.

In the specific implementation, in the embodiment of the present disclosure, in the second display area bb, the drive transistor is electrically connected to the corresponding light-emitting device by the anode wiring. Exemplarily, as shown in FIG. 2A and FIG. 3A, the light-emitting devices 211 in the sub-pixels with the same color may be electrically connected to the same pixel drive circuit by the anode wiring 001. For example, the red light-emitting devices 211 in red sub-pixel R are electrically connected to the same pixel drive circuit by the anode wire 001. The green light-emitting devices 211 in green sub-pixel G are electrically connected to the same pixel drive circuit by the anode wiring 001. The blue light emitting devices 211 in blue sub-pixel B are electrically connected to the same pixel drive circuit by the anode wiring 001.

Figure 2B:
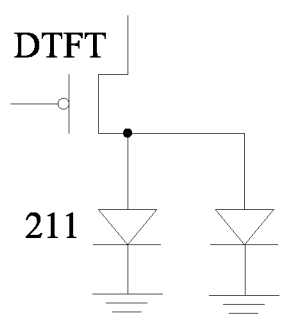
FIG. 2B is a schematic structural diagram of a pixel drive circuit and a light-emitting device in a second display area of the display panel shown in FIG. 2A.
Figure 3B:
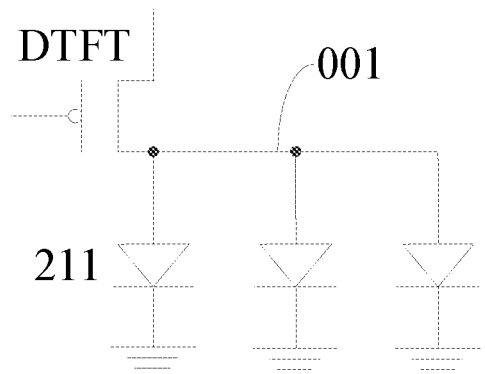
FIG. 3B is a schematic structural diagram of a pixel drive circuit and a light-emitting device in a second display area of the display panel shown in FIG. 3A.

In specific implementation, in the embodiment of the present disclosure, as shown in FIG. 2A to FIG. 3B, each drive transistor DTFT is electrically connected with at least two light-emitting devices 211 with the same light emitting color by the anode wiring 001. Specifically, as shown in FIG. 2B, two red light-emitting devices 211 corresponding to the red sub-pixels R are connected to the same drive transistor DTFT by the anode wiring 001. Three green light-emitting devices 211 corresponding to the green sub-pixels G are connected to the same drive transistor DTFT by the anode wiring 001. And three blue light-emitting devices 211 corresponding to the blue sub-pixels B are connected to the same drive transistor DTFT by the anode wiring 001. As shown in FIG. 3B, three red light-emitting devices 211 corresponding to the red sub-pixels R are connected to the same drive transistor DTFT by the anode wiring 001. Three green light-emitting devices 211 corresponding to the green sub-pixels G are connected to the same drive transistor DTFT by the anode wiring 001. And three blue light-emitting devices 211 corresponding to the blue sub-pixels B are connected to the same drive transistor DTFT by the anode wiring 001. In this way, the anode wiring 001 may be configured to connect the light-emitting devices with the same color near the second display area, so as to improve the life and luminance of the light-emitting devices.

As shown in FIG. 2B and FIG. 3B, in the second display area bb, one pixel drive circuit simultaneously drives at least two light-emitting devices with the same color to emit the light, while as shown in FIG. 1B, one pixel drive circuit only drives one light-emitting device to emit light. Luminance of corresponding pixels in FIG. 2B and FIG. 3B may be twice and three times of luminance of pixels shown in FIG. 1B, and thus luminance of the display panel may be improved.

In addition, if by improving a drive current to increase the luminance of the display panel, for example, by setting a current to make solutions in FIG. 1B, FIG. 2B and FIG. 3B achieve the same luminance, the luminance of each light-emitting device in FIG. 2B is one half of the luminance of the light-emitting device shown in FIG. 1B because FIG. 2B achieves the same luminance through two light-emitting devices, and the luminance of each light-emitting device in FIG. 3B is one third of the luminance of the light-emitting device shown in FIG. 1B because FIG. 3B achieves the same luminance through three light-emitting devices. So power consumption of each corresponding light-emitting device in FIG. 2B and FIG. 3B is lower, which may improve a lifetime of the light-emitting devices.

Moreover, if the current flowing through the light-emitting device 211 as shown in FIG. 1B is already the maximum, the light-emitting device 211 will burn out if the luminance is further improved. In FIG. 2B and FIG. 3B, the corresponding current flowing through the light-emitting devices may be further increased without damaging the light-emitting devices. As a result, FIG. 2B and FIG. 3B have a longer lifetime than the light-emitting devices as shown in FIG. 1B, which may improve the luminance of the display panel.

It should be noted that the driver transistor DTFT in the embodiment of the present disclosure is illustrated by a P-type transistor. Of course, the driver transistor DTFT may also be an N-type transistor. The P-type transistor is turned off at high level and is turned on at low level. The N-type transistor is turned on at high level and turned off at low level.

In specific implementation, in the embodiment of the present disclosure, an area of the light-emitting device in the first display area is substantially the same as that of the light-emitting device in the second display area. In this way, the first display area and the second display area may use the high precision Fine Metal Mask (FMM) with the same open density and size to evaporate the electroluminescent layers of the light-emitting devices in the first display area and the second display area, and thus evaporation accuracy of the electroluminescent layers of the first display area and the second display area may be guaranteed at the same time, and the effect of display is improved.

Further, in specific implementation, in the embodiment of the present disclosure, in the first display area and the second display area with the same area, the number of light-emitting devices capable of emitting light in the first display area is greater than the number of light-emitting devices capable of emitting light in the second display area. In this way, a resolution of the first display area is higher than that of the second display area, and images with higher resolution requirements, such as played videos, may be displayed in the first display area. The second display area displays images with low resolution requirements, such as time, weather and other information.

In specific implementation, in the embodiment of the present disclosure, as shown in FIG. 2A and FIG. 3A, in the second display area bb, at least part of the light-emitting devices 211 electrically connected to the same pixel drive circuit may be arranged into at least two columns. For example, as shown in FIG. 2A, in the second display area bb, the red light-emitting devices 211 electrically connected to the same pixel drive circuit are arranged into two columns, the blue light-emitting devices 211 electrically connected to the same pixel drive circuit are arranged into two columns, and part of green light-emitting devices 211 electrically connected to the same pixel drive circuit are arranged into one column, and the rest green light-emitting devices 211 electrically connected to the same pixel drive circuit are arranged into two columns. For example, as shown in FIG. 3A, the red light-emitting devices 211 electrically connected to the same pixel drive circuit are arranged into two columns, the blue light-emitting devices 211 electrically connected to the same pixel drive circuit are arranged into two columns, and the green light-emitting devices 211 electrically connected to the same pixel drive circuit are arranged into two columns. Of course, the present disclosure includes but is not limited to the above arrangement.

Exemplarily, in the specific implementation, in the embodiment of the present disclosure, as shown in FIG. 2A and FIG. 3A, in the second display area bb, the red light-emitting devices 211 (that is, red light-emitting devices 211 in the red sub-pixels R) electrically connected to the same pixel drive circuit are arranged into at least two columns, and the red light-emitting devices 211 in adjacent columns are staggered. For example, as shown in FIG. 2A, the red light-emitting devices 211 electrically connected to the same pixel drive circuit are arranged into two columns, wherein one column of the red light-emitting devices 211 is not in the same row of sub-pixels as the other. As shown in FIG. 3A, the red light-emitting devices 211 electrically connected to the same pixel drive circuit are arranged into two columns, wherein one column has two red light-emitting devices 211 while the other column has one red light-emitting device 211, and the red light-emitting devices 211 in the two columns are not in the same row of sub-pixels.

Exemplarily, in the specific implementation, in the embodiment of the present disclosure, as shown in FIG. 3A, in the second display area bb, three red light-emitting devices 211 may be electrically connected to the same pixel drive circuit. Moreover, in the second display area bb, for the red light-emitting devices 211 electrically connected to the same pixel drive circuit, a distance between two adjacent red light-emitting devices 211 in the same column is substantially equal to a width W1 of a red light-emitting device in a column direction F1.

Exemplarily, in specific implementation, in the embodiment of the present disclosure, as shown in FIG. 2A and FIG. 3A, in the second display area bb, the blue light-emitting devices 211 (that is, blue light-emitting devices 211 in the blue sub-pixels B) electrically connected to the same pixel drive circuit are arranged into at least two columns, and the blue light-emitting devices 211 in adjacent columns are staggered. For example, as shown in FIG. 2A, the blue light-emitting devices 211 electrically connected to the same pixel drive circuit are arranged into two columns, wherein one column of the blue light-emitting devices 211 is not in the same row of sub-pixels as the other. As shown in FIG. 3A, the blue light-emitting devices 211 electrically connected to the same pixel drive circuit are arranged into two columns, wherein one column has two blue light-emitting devices 211 while the other column has one blue light-emitting device 211, and the blue light-emitting devices 211 in the two columns are not in the same row of sub-pixels.

Exemplarily, in specific implementation, in the embodiment of the present disclosure, as shown in FIG. 3A, in the second display area bb, three blue light-emitting devices 211 may be electrically connected to the same pixel drive circuit. Moreover, in the second display area bb, for the blue light-emitting devices 211 electrically connected to the same pixel drive circuit, a distance between two adjacent blue light-emitting devices 211 in the same column is substantially equal to a width W1 of a blue light-emitting device in the column direction F1. Of course, the present disclosure includes but is not limited to the above content.

Exemplarily, in specific implementation, in the embodiment of the present disclosure, as shown in FIG. 2A, in the second display area bb, part of the green light-emitting devices electrically connected to the same pixel drive circuit are arranged into at least two columns, and at least part of the green light-emitting devices in the adjacent columns are arranged in the same row. In addition, in the second display area bb, the rest of the green light-emitting devices 211 electrically connected to the same pixel drive circuit are arranged in a column. For example, as shown in FIG. 2A, in the second display area bb, the green light-emitting devices 211 electrically connected to the same pixel drive circuit are arranged into two columns, wherein one column has a green light-emitting device 211 while the other column has a green light-emitting device 211, and the green light-emitting devices 211 arranged in the same row are in different columns.

Exemplarily, in specific implementation, in the embodiment of the present disclosure, as shown in FIG. 3A, in the second display area bb, the green light-emitting devices 211 (that is, the green light-emitting devices 211 in the green sub-pixels G) electrically connected to the same pixel drive circuit are arranged into at least two columns, and at least part of the green light-emitting devices 211 in adjacent columns are arranged in the same row. As shown in FIG. 3A, in the second display area bb, the green light-emitting devices 211 electrically connected to the same pixel drive circuit are arranged into two columns, wherein one column has two green light-emitting devices 211 while the other column has a green light-emitting device 211, and the green light-emitting devices 211 arranged in the same row are in different columns.

Exemplarily, in specific implementation, in the embodiment of the present disclosure, as shown in FIG. 2A and FIG. 3A, in the second display area bb, for the green light-emitting devices 211 arranged into at least two columns and electrically connected to the same pixel drive circuit, a distance between two adjacent green light-emitting devices 211 in the same row is substantially equal to a width W2 of a green light-emitting device in the row direction F2. Of course, the present disclosure includes but is not limited to the above content.

Figure 4:
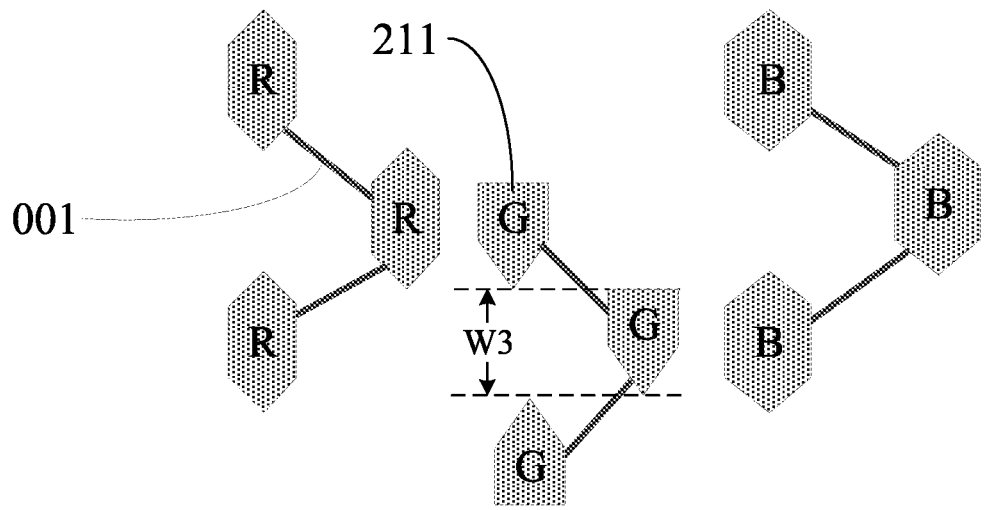
FIG. 4 is a schematic structural diagram of a second display area in some display panels provided by an embodiment of the present disclosure.

Exemplarily, in specific implementation, in the embodiment of the present disclosure, as shown in FIG. 4, in the second display area bb, the green light-emitting devices 211 (that is, green light-emitting devices 211 in the green sub-pixels G) electrically connected to the same pixel drive circuit are arranged into at least two columns, and the green light-emitting devices 211 in adjacent columns are staggered. As shown in FIG. 4, in the second display area bb, the green light-emitting devices 211 electrically connected to the same pixel drive circuit are arranged into two columns, wherein one column has two green light-emitting devices 211 while the other column has one green light-emitting device 211, and the green light-emitting devices 211 in the two columns are not in the same row of sub-pixels. It should be noted that FIG. 4 only illustrates the example of the red sub-pixel R, the green sub-pixel G and the blue sub-pixel B in the second display area bb.

Exemplarily, in specific implementation, in the embodiment of the present disclosure, as shown in FIG. 4, in the second display area bb, at least three light-emitting devices of the same light emitting color are electrically connected to the same pixel drive circuit. For example, three green light-emitting devices are electrically connected to the same pixel drive circuit. For the green light-emitting devices 211 electrically connected to the same pixel drive circuit, a distance between two adjacent green light-emitting devices 211 in the same column is substantially equal to a width W3 of a green light-emitting device 211 in the column direction F1.

It should be noted that the electroluminescent display device is located in a sub-pixel area, and the embodiment of the present disclosure only illustrates arrangement of the sub-pixels, not shows the pixel drive circuits.

It should be noted that in an actual process, due to the limitation of process conditions or other factors, the words referring to the same and equal in the above features cannot be all the same, and there may be some deviations. Therefore, the same relationship among the above features are established as long as the above conditions are generally met, and are within the protection scope of the present disclosure. For example, the above "same" may be the "same" allowed within the allowable error range.

Figure 8:
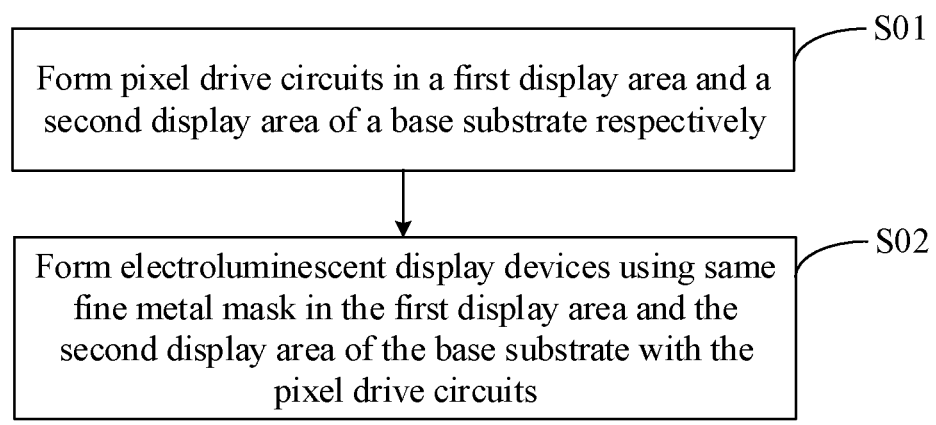
FIG. 8 is a flow chart of a manufacture method provided by an embodiment of the present disclosure.

Based on the same inventive idea, the embodiment of the present disclosure also provides a method for manufacturing the above display panel, as shown in FIG. 8, which may include the following steps.

S01: Pixel drive circuits are formed in a first display area and a second display area of a base substrate. Exemplarily, a buffer layer 125, an active layer 121, a gate insulating layer 126, a gate layer 122, an interlayer dielectric layer 127, a capacitor electrode layer 123, an interlayer insulating layer 128, a source/drain electrode layer 124, and a planarization layer 129 are formed on the base substrate successively.

S02: The electroluminescent display devices are formed using the same fine metal mask in the first display area and the second display area of the base substrate on which the pixel drive circuits have been formed. Where open density of the fine metal mask corresponding to the first display area is the same as that corresponding to the second display area. Exemplarily, an anode layer 111, a pixel defining layer, an electroluminescent layer 112 and a cathode layer 113 are formed on the base substrate successively. The electroluminescent layers 112 of electroluminescent display devices are formed using the same fine metal mask respectively in the first display area and the second display area of the base substrate with the formed pixel drive circuits.

Figure 7A:
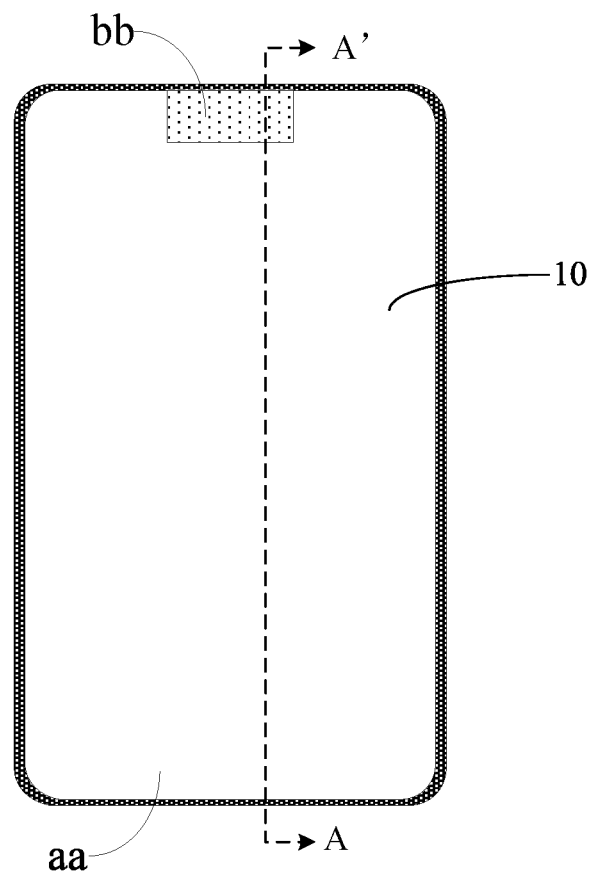
FIG. 7A is a top-view of a display apparatus provided by an embodiment of the present disclosure.
Figure 7B:
FIG. 7B is a sectional view of the display apparatus shown in FIG. 7A along a direction of AA'.

Based on the same inventive concept, the embodiment of the present disclosure further provides a display apparatus, as shown in FIG. 7A and FIG. 7B, which may include the above display panel 10 according to the embodiment of the present disclosure. Since the principle of solving the problem of the display apparatus is similar to that of the aforementioned display panel, for the implementation of the display apparatus, reference may be made to the implementation of the aforementioned display panel. And no repetition will be made herein.

In specific implementation, the display apparatus provided by the embodiment of the present disclosure may be a full-screen mobile phone as shown in FIG. 7A and FIG. 7B. Of course, the above display device provided by the embodiment of the present disclosure may also be any product or component with a display function, such as a tablet computer, a television, a display, a notebook computer, a digital photo frame, and a navigator. The other indispensable components of the display apparatus should be understood by those of ordinary skill in the art, and will not be repeated here, nor should it be used as a limitation to the present disclosure.

In specific implementation, in the embodiment of the present disclosure, as shown in FIG. 7A and FIG. 7B, a phone frame 20 is arranged around the display panel 10, the sensor 30 (such as a photosensitive device for a camera, a light-sensitive device for a fingerprint transmitter) may be arranged on the back of the display panel 10 corresponding to the second display area bb. In order to increase intensity of light received by the sensor 30 to improve the performance of the photosensitive device, an orthographic projection of the sensor 30 does not overlap with that of the pixel drive circuit on the base substrate of the display panel. Moreover, as the number of pixel drive circuits in the second display area decreases relative to the first display area, the transmittance of the second display area increases. Therefore, arranging the sensor 30 on the back of the corresponding display panel in the second display area may improve intensity of light received by the photosensitive device, thus improving the performance of the sensor 30. For example, the display panel needs to be equipped with photosensitive elements having intelligent functions such as an infrared sensor function, which may enhance infrared light transmittance and achieve the purpose of infrared detection.

The embodiment of the present disclosure provides the above display panel, the manufacture method thereof and the display apparatus. The electroluminescent display device can be manufactured by making the distribution density of electroluminescent display devices in the first display area aa and the second display area bb equal and by using the same mask. The transmittance of the second display area may be improved by making the distribution density of the pixel drive circuits in the second display area bb less than that of the pixel drive circuits in the first display area aa. So the sensor and other elements may be arranged on the back of the display panel corresponding to the second display area bb so that the bezel space originally required by the sensor and other elements may be eliminated, and a screen ratio of a display screen may be enlarged to make an extremely narrow bezel. That is, a screen ratio of the display panel is increased by reducing the distribution density of local pixel drive circuits to increase the transmittance of the screen.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. A display panel, comprising a first display area and a second display area, the first display area being located at least on a side of the second display area, and a transmittance of the second display area being greater than a transmittance of the first display area;
    a plurality of pixel units comprising electroluminescent display devices and pixel drive circuits for driving the electroluminescent display devices to emit light;
    wherein
        the pixel drive circuits comprise first pixel drive circuits in the first display area and second pixel drive circuits in the second display area,
        the electroluminescent display devices comprise first light-emitting devices in the first display area and second light-emitting devices in the second display area, and virtual light-emitting devices in the second display area; and
        the first pixel drive circuits are configured to drive the first light-emitting devices, and the second pixel drive circuits are configured to drive the second light-emitting devices, and the virtual light-emitting devices are not connected with the pixel drive circuits;
        the first light-emitting devices comprise red light-emitting devices, green light-emitting devices and blue light-emitting devices; the second light-emitting devices comprise red light-emitting devices, green light-emitting devices and blue light-emitting devices;

the green light-emitting devices in the first display area and the green light-emitting devices in the second display area are arranged in a same first pixel column;

the red light-emitting devices and the blue light-emitting devices in the first display area form a second pixel column with the red light-emitting devices and the blue light-emitting devices in the second display area;

the first pixel column and the second pixel column are alternately arranged in a row direction;

the second display area comprises a plurality of pixel groups, the plurality of pixel groups are arranged at least in six adjacent pixel columns, and each of the plurality of pixel groups comprises:

at least two green light-emitting devices located in different pixel columns, or at least two green light-emitting devices located in a same pixel column; and at least two red light-emitting devices located in different pixel columns, or at least two blue light-emitting devices located in different pixel columns;

wherein, in each of the plurality of pixel groups, at least one column of the virtual light-emitting devices is arranged between the green light-emitting devices in different pixel columns, at least one column of the virtual light-emitting devices is arranged between the red light-emitting devices in different pixel columns, and at least one column of the virtual light-emitting devices is arranged between the blue light-emitting devices in different pixel columns.

2. The display panel according to claim 1, wherein a distribution density of the second light-emitting devices and the virtual light-emitting devices in the second display area is same as a distribution density of the first light-emitting devices in the first display area.

3. The display panel according to claim 1, wherein a density of the second pixel drive circuits is less than a density of the first pixel drive circuits.

4. The display panel according to claim 1, wherein at least one of the second light-emitting devices is electrically connected to at least one of the second pixel drive circuits correspondingly.

5. The display panel according to claim 1, wherein in the second display area, at least two of the second light-emitting devices with a same light emitting color are electrically connected to a same second pixel drive circuit.

6. The display panel according to claim 5, wherein in the second display area, at least part of the second light-emitting devices electrically connected to the same second pixel drive circuit are arranged in at least two columns.

7. The display panel according to claim 6, wherein:

in the second display area, the red light-emitting devices electrically connected to the same second pixel drive circuit are arranged in at least two columns, and at least part of the red light-emitting devices in adjacent columns are staggered; and in the second display area, the blue light-emitting devices electrically connected to the same second pixel drive circuit are arranged in at least two columns, and at least part of the blue light-emitting devices in adjacent columns are staggered.

8. The display panel according to claim 7, wherein in the second display area, at least part of the green light-emitting devices electrically connected to the same second pixel drive circuit are arranged in at least two columns, and at least part of the green light-emitting devices in adjacent columns are arranged in a same row.

9. The display panel according to claim 8, wherein in the second display area, the green light-emitting devices electrically connected to the same second pixel drive circuit are arranged in at least two columns, and at least part of the green light-emitting devices in the adjacent columns are staggered.

10. The display panel according to claim 6, wherein:

in the second display area, the red light-emitting devices electrically connected to the same second pixel drive circuit are arranged in at least two rows, and at least part of the red light-emitting devices in adjacent rows are staggered; and in the second display area, the blue light-emitting devices electrically connected to the same second pixel drive circuit are arranged in at least two rows, and at least part of the blue light-emitting devices in adjacent rows are staggered.

11. The display panel according to claim 10 wherein in the second display area, the green light-emitting devices electrically connected to the same second pixel drive circuit are arranged in at least two rows, and at least part of the green light-emitting devices in the adjacent rows are staggered.

12. The display panel according to claim 1, wherein the virtual light-emitting devices, the first light-emitting devices and the second light-emitting devices are configured to be prepared simultaneously through a same fine metal mask.

13. The display panel according to claim 1, wherein the virtual light-emitting devices and the second light-emitting devices are staggered at least in a first direction, and the first direction is a row extension direction or a column extension direction.

14. The display panel according to claim 1, wherein a density of the virtual light-emitting devices is greater than a density of the second light-emitting devices.

15. The display panel according to claim 1, wherein at least one of the second pixel drive circuits comprises a drive transistor;

wherein in the second display area, the drive transistor is electrically connected to corresponding second light-emitting device through an anode wiring.

16. The display panel according to claim 1, wherein the first display area is arranged around the second display area.

17. A display apparatus, comprising the display panel according to claim 1.

18. The display apparatus according to claim 17, further comprising a sensor arranged on a side of the display panel;

wherein an orthographic projection of the sensor on the display panel is at least partially located in the second display area.

19. The display apparatus according to claim 17, wherein a distribution density of the second light-emitting devices and virtual light-emitting devices in the second display area is same as a distribution density of the first light-emitting devices in the first display area.

20. The display apparatus according to claim 17, wherein a density of the second pixel drive circuits is less than a density of the first pixel drive circuits.

* * * * *